US011927544B2

(12) United States Patent
Chen

(10) Patent No.: US 11,927,544 B2
(45) Date of Patent: Mar. 12, 2024

(54) WAFER DEFECT TRACING METHOD AND APPARATUS, ELECTRONIC DEVICE AND COMPUTER READABLE MEDIUM

(71) Applicant: CHANGXIN MEMORY TECHNOLOGIES, INC., Hefei (CN)

(72) Inventor: Yui-Lang Chen, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 303 days.

(21) Appl. No.: 17/475,628

(22) Filed: Sep. 15, 2021

(65) Prior Publication Data

US 2022/0082511 A1 Mar. 17, 2022

Related U.S. Application Data

(63) Continuation of application No. PCT/CN2021/103716, filed on Jun. 30, 2021.

(30) Foreign Application Priority Data

Sep. 11, 2020 (CN) .......................... 202010953000.9

(51) Int. Cl.
G01N 21/95 (2006.01)
G06T 7/00 (2017.01)
H01L 21/66 (2006.01)

(52) U.S. Cl.
CPC ....... *G01N 21/9505* (2013.01); *G06T 7/0008* (2013.01); *H01L 22/12* (2013.01); G06T 2207/30148 (2013.01)

(58) Field of Classification Search
CPC .............. G01N 21/9505; G06T 7/0008; G06T 2207/30148; H01L 22/12; H01L 22/10; H01L 22/20
See application file for complete search history.

(56) References Cited

U.S. PATENT DOCUMENTS

| | | | |
|---|---|---|---|
| 7,805,258 B2 | 9/2010 | Fu | |
| 9,401,014 B2* | 7/2016 | Zafar | ..................... G06F 30/398 |
| 11,231,376 B2* | 1/2022 | Chen | ................... G01N 21/9505 |
| 2008/0199978 A1 | 8/2008 | Fu | |
| 2013/0016895 A1 | 1/2013 | Song | |
| 2020/0400589 A1* | 12/2020 | Feldman | ............... G06T 7/0008 |

(Continued)

FOREIGN PATENT DOCUMENTS

| | | |
|---|---|---|
| CN | 1521822 A | 8/2004 |
| CN | 100371939 C | 2/2008 |
| CN | 101246831 A | 8/2008 |

(Continued)

*Primary Examiner* — Hung V Nguyen
(74) *Attorney, Agent, or Firm* — Cooper Legal Group, LLC

(57) ABSTRACT

Provided are a wafer defect tracing method and apparatus, an electronic device and a computer readable medium. The method includes: obtaining defect data of a wafer; obtaining position data of fail bits of the wafer; determining a defect area of a storage block in the wafer according to the defect data; determining a fail bit count of the storage block in the wafer according to the position data of the fail bits; processing the defect area and the fail bit count of each storage block in the wafer, so as to obtain a correlation coefficient; and determining an abnormal reason for the fail bits of the wafer according to the correlation coefficient.

9 Claims, 7 Drawing Sheets

(56) References Cited

U.S. PATENT DOCUMENTS

2021/0279848 A1* 9/2021 Greenberg .............. G06T 7/001

FOREIGN PATENT DOCUMENTS

| CN | 104916559 | A | 9/2015 |
| CN | 109767996 | A | 5/2019 |
| CN | 111198924 | A | 5/2020 |
| DE | 10000690 | B4 | 5/2009 |
| TW | I226591 | B | 1/2005 |

* cited by examiner

WAFER DEFECT TRACING METHOD AND APPARATUS, ELECTRONIC DEVICE AND COMPUTER READABLE MEDIUM

CROSS-REFERENCE TO RELATED APPLICATIONS

This is continuation of international application PCT/CN2021/103716, filed on Jun. 30, 2021, which claims priority to Chinese patent application No. 202010953000.9, filed on Sep. 11, 2020 and entitled "Wafer Defect Tracing Method and Apparatus, Electronic Device and Computer Readable Medium". The contents of international application PCT/CN2021/103716 and Chinese patent application No. 202010953000.9 are hereby incorporated by reference in their entireties.

TECHNICAL FIELD

The disclosure relates to the technical field of semiconductors, and in particular relates to a wafer defect tracing method and apparatus, an electronic device and a computer readable medium.

BACKGROUND

During manufacturing of a wafer, a defect often appears on the wafer, and the reason for the defect may be that there are too many suspended particles in the air, and may also be that the wafer is not effectively cleaned in certain steps. The appearance of the defect can easily cause the generation of Fail Bits (FBs). When there are too many FBs, limited backup circuits cannot repair all the FBs, which results in that a chip is judged as a defective product.

Therefore, the appearance of too may defects will cause great reduction in the yield of the wafer.

In consequence, a new wafer defect tracing method and apparatus, electronic device and computer readable medium are required.

It is to be noted that the information disclosed in the background portion is only used to strengthen the understanding to the background of the disclosure and thus may include information that does not form a related art known to those of ordinary skill in the art.

SUMMARY

In view of this, the embodiments of the disclosure provide a wafer defect tracing method and apparatus, an electronic device and a computer readable medium.

Other characteristics and advantages of the disclosure will be apparent through detailed description below, or partly learned through practice of the disclosure.

According to an aspect of the disclosure, a wafer defect tracing method is provided. The method may include: defect data of a wafer is obtained; position data of an FB of the wafer is obtained; a defect area of a storage block in the wafer is determined according to the defect data; the FB Count (FBC) of the storage block in the wafer is determined according to the position data of the FB; the defect area and the FBC of the storage block in the wafer are processed to obtain a correlation coefficient; and an abnormal reason for the FB of the wafer is determined according to the correlation coefficient.

According to an aspect of the disclosure, a wafer defect tracing apparatus is provided. The apparatus may include: a defect data module, configured to obtain defect data of a wafer; an FB data module, configured to obtain position data of an FB of the wafer; a defect area counting module, configured to determine a defect area of a storage block in the wafer according to the defect data; an FBC module, configured to determine the FBC of the storage block in the wafer according to the position data of the FB; a correlation coefficient module, configured to process the defect area and the FBC of the storage block in the wafer to obtain a correlation coefficient; and a defect tracing module, configured to determine an abnormal reason for the FB of the wafer according to the correlation coefficient.

According to an aspect of the disclosure, an electronic device is provided. The electronic device may include one or more processors, and a storage device configured to store one or more programs. When executed by the one or more processors, the one or more programs enable the one or more processors to implement the abovementioned method.

According to an aspect of the disclosure, a computer readable medium is provided, on which a computer program is stored. When executed by a processor, the program implements the abovementioned method.

DETAILED DESCRIPTION

Figure 1:
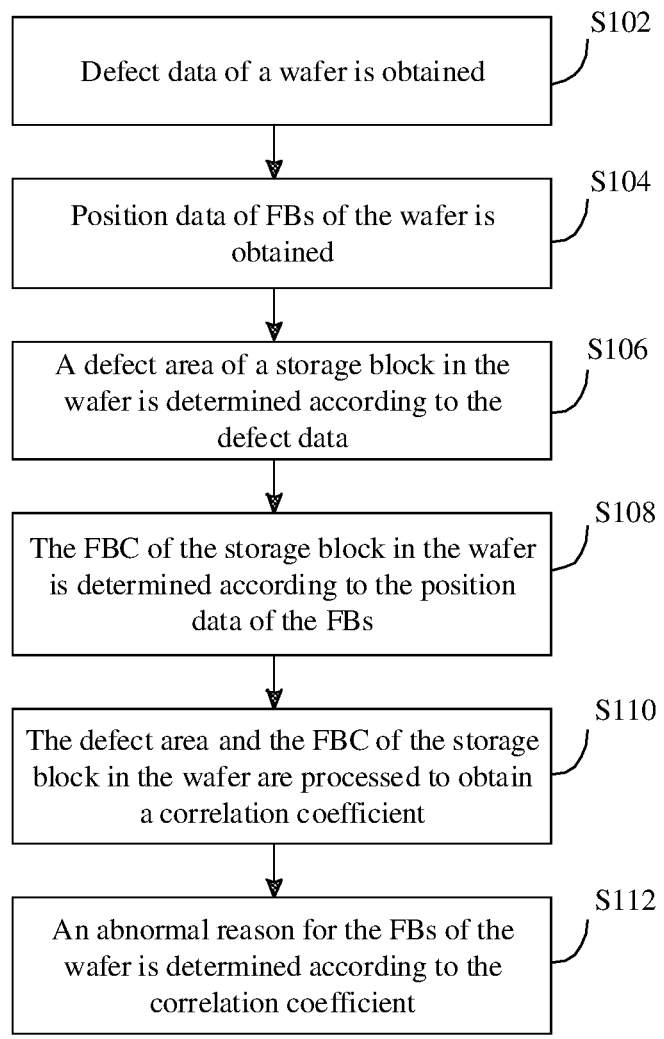
FIG. 1 is a flowchart of a wafer defect tracing method shown in an exemplary embodiment.

Exemplary embodiments will now be described more comprehensively with reference to the drawings. However, the exemplary embodiments may be implemented in various forms, and should not be understood to be limited to embodiments elaborated herein. Instead, these embodiments are provided to make the disclosure comprehensive and complete and comprehensively communicate the ideas of the exemplary embodiments to those skilled in the art. The same signs in the drawings show same or similar parts, so that repetitive description of them is omitted.

Moreover, the described features, structures or characteristics may be combined in one or more embodiments in any appropriate manner. In the following descriptions, many specific details are provided to fully understand the embodiments of the disclosure. However, those skilled in the art will realize that: the embodiments of the disclosure may be practiced and one or more of the specific details are omitted, or other methods, components, devices, steps and the like may be adopted. In other cases, known methods, devices, realization or operation will not be shown or described in detail to avoid each aspect of the disclosure from being obscured.

Block diagrams shown in the drawings are merely functional entities, which may not need to correspond to physically independent entities. Namely, these functional entities may be implemented in a software form, or these functional entities are implemented in one or more hardware modules or integrated circuits, or these functional entities are implemented in different networks and/or processor devices and/or microcontroller devices.

The flowcharts shown in the drawings are merely exemplary descriptions, do not necessarily include all the content and operations/steps, and are not necessarily performed in the described order. For example, some operations/steps may also be broken down, while some operations/steps may be merged or partially merged, so that the order of actual execution may vary depending on the actual situation.

It should be understood that, although terms such as first, second and third may be used for describing various components in the disclosure, these components should not be limited by these terms. These terms are used for distinguishing a component from another component. Therefore, a first component discussed below may be called as a second component, not departing from teaching of the conception of the disclosure. As used in the disclosure, term "and/or" includes any and one or more combinations of the related listed items.

It should be understood by those skilled in the art that, the drawings are merely schematic diagrams of the exemplary embodiments, and modules or flows in the drawings are not necessary for implementing the disclosure, so that it may not be used to limit the scope of protection of the disclosure.

FIG. 1 is a flowchart of a wafer defect tracing method shown in an exemplary embodiment. The wafer defect tracing method provided by the embodiment of the disclosure may be executed by any electronic device having the computational processing capacity, such as a user terminal and/or a server. In the embodiments below, illustration is made by taking the server executing the method as an example, but the disclosure is not limited thereto. The wafer defect tracing method provided by the embodiment of the disclosure may include the steps S102 to S112.

As shown in FIG. 1, in S102, defect data of a wafer is obtained.

In the embodiment of the disclosure, the defect data provides detailed data of defects, which may include the count of the defects, defect area data of an area of the defects in the wafer and position information of the defects in the wafer, structure layer information where the defect data is located, etc.

Specifically, the defect data may include: an absolute position, a relative position, an area, a type, a structure layer, etc. Herein, the absolute position is a coordinate position based on the range of a wafer. The relative position is a coordinate position based on the range of a chip. The type is a type analyzed by a pattern identification system. The structure layer is a certain layer in the wafer. Each layer may be processed through one or more manufacturing processes. ADDR is used for recording if the defect is a new defect; in other words, it does not exist in the previous older layer.

In S104, position data of FBs of the wafer is obtained.

In the embodiment of the disclosure, the position data of the FB may be obtained through a Circuit Probing (CP) test. CP is a process that each grain on the wafer is probed, a detection head is provided with a probe as fine as hair and made of a gold wire, and the probe makes contact with a pad on the grain to test the electrical characteristics thereof. The FB is an unqualified unit obtained in a wafer testing process.

In S106, a defect area of a storage block in the wafer is determined according to the defect data.

In the embodiment of the disclosure, in a wafer, a plurality of chips may be included, the organization architecture of one chip may include a plurality of storage banks, each storage bank may be divided into left and right storage blocks of the same size (Half-Bank) (different products have different division methods, and some are also divided into four blocks). Each storage block has a storage array, the storage array may include a plurality of storage units defined by bit lines and word lines in a crossing manner, and one storage unit represents one bit. In the step, the storage block in the wafer is used as the research granularity, in other embodiments, a quarter of storage bank is also used as the research granularity, and the disclosure is not particularly limited to this.

Figure 2:
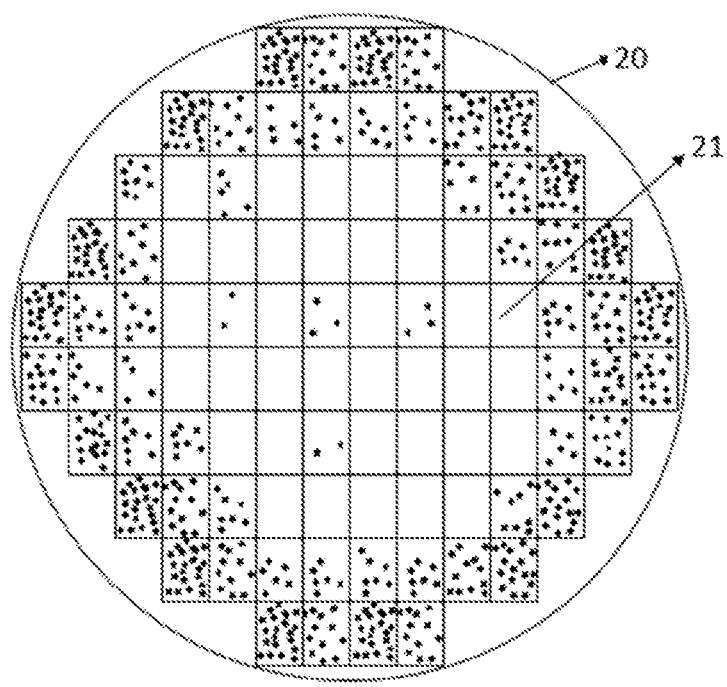
FIG. 2 is a schematic diagram of a wafer shown in an exemplary embodiment.
Figure 3:
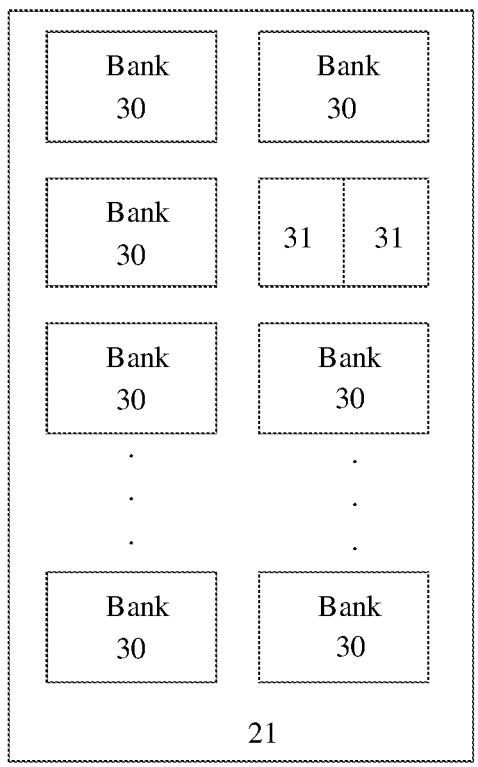
FIG. 3 is a schematic diagram of a chip shown in an exemplary embodiment.

FIG. 2 is a schematic diagram of a wafer shown in an exemplary embodiment. As shown in FIG. 2, a cell in the wafer 20 is a chip 21. FIG. 3 is a schematic diagram of a chip shown in an exemplary embodiment. As shown in FIG. 3, the chip 21 may include a plurality of storage banks 30, and each storage bank may be divided into left and right storage blocks 31 of the same size.

In the embodiment of the disclosure, the defect data corresponding to the position of the storage block may be determined according to the defect data, and the total area of all defects in the storage block is calculated, and is used as the defect area of the storage block in the wafer.

In S108, the FBC of the storage block in the wafer is determined according to the position data of the FB.

In the embodiment of the disclosure, the FB data corresponding to the position of the storage block may be determined according to the position data of the FB, and the count of all FBs in the storage block is calculated, and is used as the FBC of the storage block in the wafer.

In S110, the defect area and the FBC of the storage block in the wafer are processed to obtain a correlation coefficient.

A defect may or may not cause the generation of an FB. Therefore, the correlation coefficient obtained by processing the defect area and the FBC of each storage block in the wafer may represent whether the defect and formation of the FB have a causal relationship or not.

In the embodiment of the disclosure, the defect area and the FBC of each storage block in the wafer may be obtained by counting, and correlation analysis is executed by taking the storage block as the granularity, and the defect area and the FBC of each storage block as horizontal and vertical coordinates respectively, so as to obtain the correlation coefficient.

In S112, an abnormal reason for the FBs of the wafer is determined according to the correlation coefficient.

In the embodiment of the disclosure, a formation reason for the defect having the causal relationship may be determined through the correlation coefficient. The formation reason may be in a manufacturing process in which the defect is formed.

According to the wafer defect tracing method provided by the implementation mode of the disclosure, a relationship is established by utilizing the defect data of the wafer and the position data of the FB, to obtain the correlation coefficient representing the correlation relationship between the defect data and the FB, whether the defect data is a formation reason for the FB or not is judged based on the correlation coefficient, so that an abnormal reason causing the wafer to generate the FB is facilitated to be determined based on the manufacturing process data of the wafer, an abnormal problem is facilitated to be solved rapidly, and the yield of the wafer is improved.

In an exemplary embodiment, in S110, a DAR of the wafer may be obtained according to the defect data; a defect area index of the storage block in the wafer is determined according to a ratio of the defect area of the storage block in the wafer to the area of the DAR; an FB index of the storage block in the wafer is determined according to a ratio of the FBC of the storage block in the wafer to the DAR; and correlation analysis on the defect area index and the corresponding FB index of the storage block in the wafer is executed, so as to obtain the correlation coefficient.

The DAR is a range possibly causing the FB. In the embodiment, the defect area index and the FB index of each storage block in the wafer may be obtained by counting, and correlation analysis is executed by taking the storage block as the granularity, and the defect area index and the FB index of each storage block as horizontal and vertical coordinates respectively, so as to obtain the correlation coefficient. Correlation analysis on the defect area index and the FB index is executed, compared with the embodiment as shown in FIG. 1, different wafers have the same scaling degree, and thus the observability of correlation analysis is improved.

In an exemplary embodiment, the operation of executing correlation analysis on the defect area index and the corresponding FB index of the storage block in the wafer to obtain the correlation coefficient may include the following steps: a storage block containing abnormal data in the wafer is removed to obtain a target storage block set; and correlation analysis on the defect area index and the corresponding FB index of the storage block in the target storage block set is executed to obtain the correlation coefficient.

When the storage block containing abnormal data in the wafer is removed, one or more following conditions may be included: (1) a storage block, the FB index of which is greater than an FB index threshold value, in the wafer is removed, to obtain a target storage block set; (2) a storage block, the FBC of which is greater than an FBC threshold value, in the wafer is removed, to obtain a target storage block set.

Figure 4:
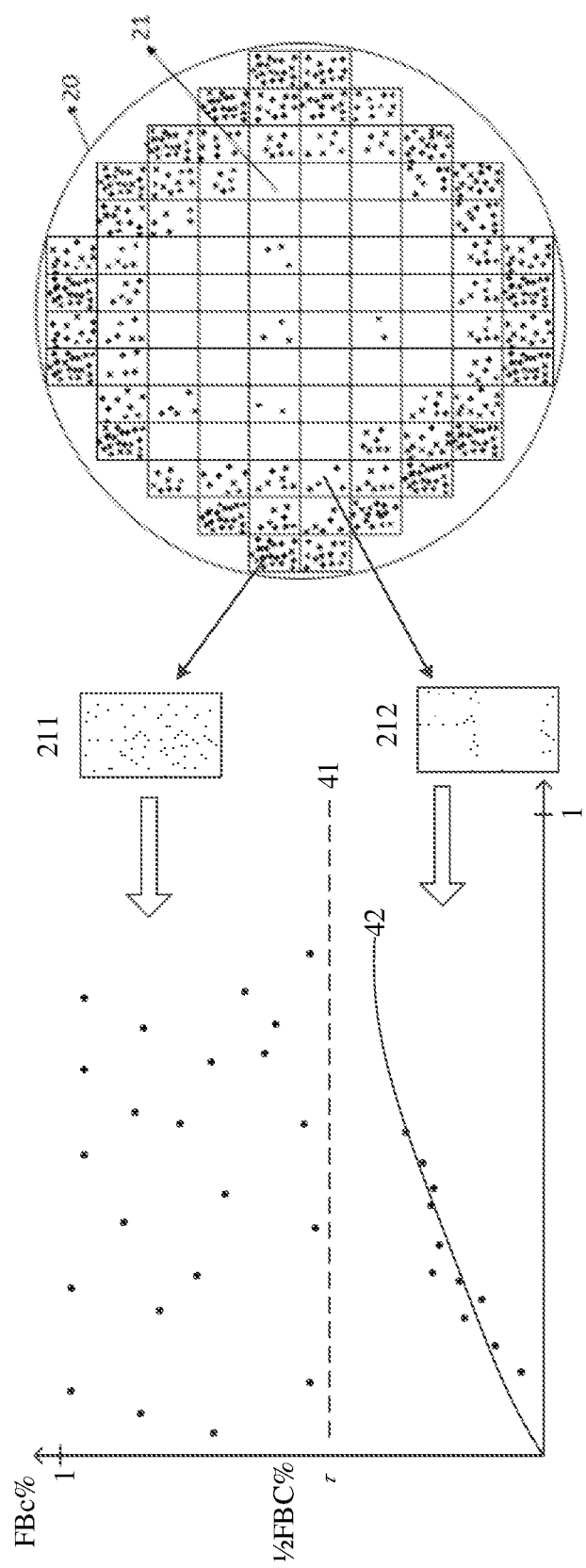
FIG. 4 is a schematic diagram of a correlation analysis process shown in an exemplary embodiment.

FIG. 4 is a schematic diagram of a correlation analysis process shown in an exemplary embodiment. As shown in FIG. 4, the FB index threshold value $\tau$ is used for filtering out part of chips (cells with many FBs in FIG. 1) that often have too many FBs in the manufacturing process, 211 as shown in FIG. 4, the FBs in such chips are not caused by direct influence of the defect, and the precision of correlation analysis is easily increased by removing such chips. Under normal conditions, the FB index threshold value may satisfy the following condition: $\tau < FBC/2\%$. Correlation analysis is executed according to data below a partition line 41 and satisfying that FBC % and DA % are greater than 0, a regression line 42 may be obtained, and if the correlation coefficient is greater than the correlation coefficient threshold value, it represents that the wafer is obviously abnormal. The correlation coefficient threshold value is a preset parameter, and usually, the correlation coefficient threshold value is greater than 0.5.

The chips may be divided into a plurality of areas, A, B, C, D and E, sequentially, the outermost ring is the E area, and the innermost ring is the A area. Usually, during manufacturing of the wafer, the outer ring of the wafer is more easily damaged than the inner ring, the main reason for this damage is not the defect, therefore, the data of the outer ring (such as D and E) may be ignored in analysis, so that the precision of correlation analysis is improved.

In an exemplary embodiment, in S112, manufacturing process data of the wafer may be obtained, the manufacturing process data containing structure layer information and manufacturing process information corresponding to the structure layer information; if the correlation coefficient is greater than the correlation coefficient threshold value, the structure layer information where the defect data is located is determined; and the abnormal reason is determined according to the manufacturing process information corresponding to the structure layer information where the defect data is located.

When the correlation coefficient is greater than the correlation coefficient threshold value, the structure layer information that the defect data appears may be determined, the manufacturing steps of the structural layer information are traced, and one or more manufacturing steps with abnormalities can be sequentially locked.

In an exemplary embodiment, the operation of determining the abnormal reason according to the manufacturing process information corresponding to the structure layer information where the defect data is located may include the following steps: environmental data of the manufacturing process information is obtained according to the manufacturing process information corresponding to the structure layer information where the defect data is located; and the environmental data of the manufacturing process information is analyzed, so as to obtain the abnormal reason.

When an index representing micro suspended particles in the air in the environmental data is higher than a preset threshold value, it can be determined that the environmental abnormality is the abnormal reason.

In an exemplary embodiment, the operation of determining the abnormal reason according to the manufacturing process information corresponding to the structure layer information where the defect data is located may include the following steps: the count of defects that do not cause the FB in the wafer is determined according to the defect data and the position data of the FB; a DCR of the wafer is determined according to a ratio of the count of the defects that do not cause the FB in the wafer to the total count of the defects in the defect data; the DCR of the wafer is evaluated according to an empirical rule; and if an evaluation result is abnormal, a step including a cleaning abnormal function in the manufacturing process information is determined as the abnormal reason.

During the manufacturing process of the wafer, some steps have the function of removing defects. When the cleaning function is not functioning normally in these steps (namely an abnormality occurs), it may cause defects and the generation of the FB. The DCR is equal to the count of defects without any FB in a defect coverage area divided by the total count of the defects. The DCR in normal and abnormal states will change obviously, whether abnormality occurs or not may be evaluated by comparing the calculated DCR with the DCR in the normal state. If the DCR changes obviously, an evaluation result is abnormal; and if the DCR does not change obviously, an evaluation result is normal. An empirical rule shows that, 68% of data will be distributed within a first standard deviation, 95% of data will fall within a second standard deviation, and 99.7% of data will fall within the previous three standard deviations of a mean value. The DCR falling within the first standard deviation may be judged to be normal, and the DCR falling within the second standard deviation and the third standard deviation may be judged to be abnormal.

It should be clearly understood that, how to form and use specific examples is described in the disclosure, but the principles of the disclosure are not limited to any detail of these examples. Instead, on the basis of teaching of contents of the disclosure, these principles may be applied to many other embodiments.

Figure 5:
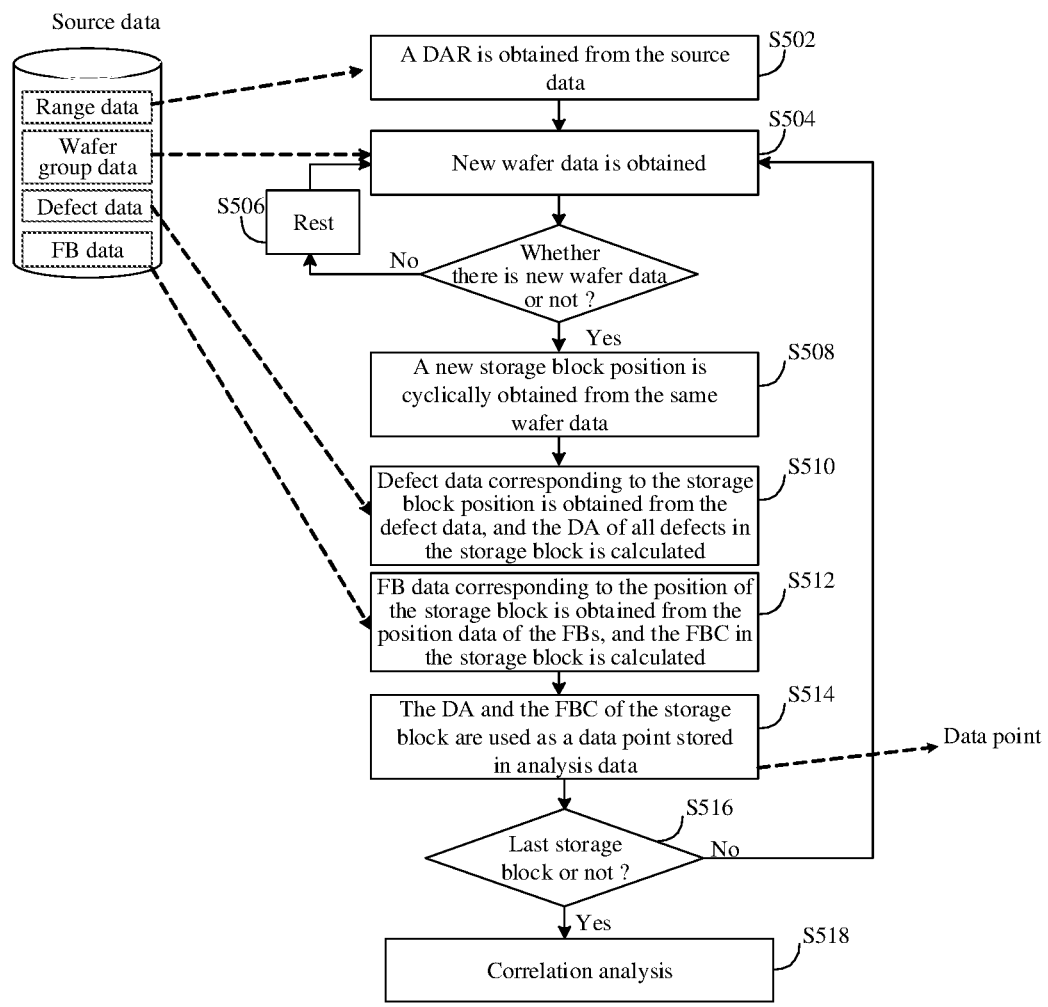
FIG. 5 is a flowchart of a wafer defect tracing method shown in an exemplary embodiment.

FIG. 5 is a flowchart of a wafer defect tracing method shown in an exemplary embodiment.

As shown in FIG. 5, the wafer defect tracing method in the embodiment of the disclosure may include the following steps.

In S502, a DAR is obtained from source data.

In the source data, range data may be included, and used for providing all fixed parameters, as follows.

(1) the range of an FB possibly caused by a defect (DAR);
(2) starting/stopping monitoring: control parameters for starting and stopping monitoring are provided;
(3) a threshold value and an alarm value: parameters for correlation analysis are provided, and the parameters may be set based on an actual condition.

Wafer group data: batch numbers, serial numbers, various relevant dates and the like of all wafers are provided.

Defect data: detailed data of the defect including an absolute position, a relative position, an area, a type, Layer, ADDR and the like are provided.

The absolute position is a coordinate position based on the range of one wafer.

The relative position is a coordinate position based on the range of one chip.

The type is a type obtained from the analysis by a pattern identification system.

Layer refers to a certain layer in the wafer. Each layer may be processed through one or more manufacturing processes.

ADDR is used for recording if the defect is a new defect; in other words, it does not exist in the previous older layer.

FB position data provides position data of FBs obtained while a CP test is executed.

Chip_region provides a region, where the chip is. In general, chips in a wafer may be divided into a plurality regions such as A, B, C, D and E.

In S504, data (called new wafer data for short) of a piece of wafer passing the CP test and not read in the process is obtained.

In S506, a short break is taken, and then next processing is continuously executed.

In S508, a new storage block position is cyclically obtained from the same wafer data.

In S510, defect data corresponding to the storage block position is obtained from the defect data, and the DA of all defects in the storage block is calculated.

In S512, the FB data corresponding to the position of the storage block is obtained from the position data of the FBs, and the FBC in the storage block is calculated.

In S514, the DA and the FBC of the storage block are used as a data point stored in analysis data.

Each data_point represents information of one storage block, including the DA, the FBC, the position information and the like of the corresponding storage block.

In S516, in case of the last storage block, the S518 is executed; otherwise, the S504 is executed.

In S518, correlation analysis is executed.

In the embodiment of the disclosure, correlation analysis is performed by executing the S110 in the embodiment as shown in FIG. 1 based on analysis data.

It should be understood by those skilled in the art that all or part steps for realizing the above embodiments may be realized by a computer program executed by a Central Processing Unit (CPU). When the computer program is executed by the CPU, the above functions limited by the method provided by the disclosure are executed. The program may be stored in a computer readable storage medium, and the storage medium may be a Read-Only Memory (ROM), a magnetic disk, an optical disk and the like.

Moreover, it is to be noted that, the above drawings are merely schematic descriptions of processes included in the methods in the exemplary embodiments of the disclosure, but not for limitation. It is to be easily understood that the processes shown in the above drawings do not show or limit the time sequence of these processes. Moreover, it is also to be easily understood that these processes may be executed synchronously or asynchronously in a plurality of modules.

The following is an embodiment of the device of the disclosure, which may be used for executing the embodiments of the method of the disclosure. Undisclosed details in the embodiments of the device of the disclosure refer to the embodiments of the method of the disclosure.

Figure 6:
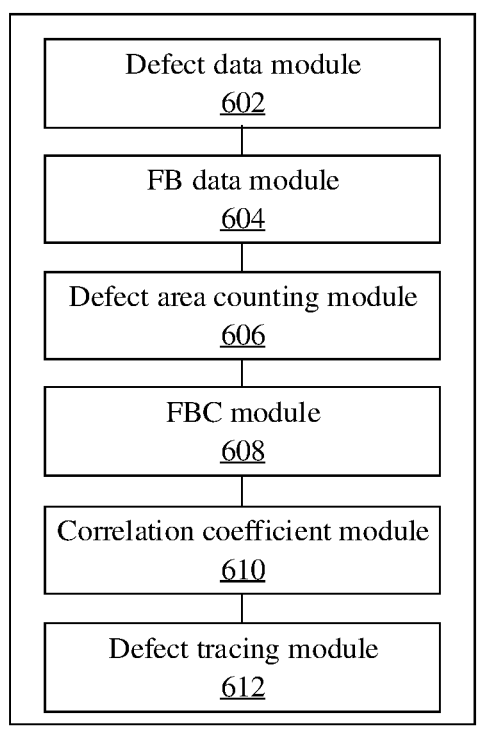
FIG. 6 is a block diagram of a wafer defect tracing apparatus shown in an exemplary embodiment.

FIG. 6 is a block diagram of a wafer defect tracing apparatus shown in an exemplary embodiment. The wafer defect tracing apparatus provided by the embodiments of the disclosure may include a defect data module 602, an FB data module 604, a defect area counting module 606, an FBC module 608, a correlation coefficient module 610 and a defect tracing module 612.

In the wafer defect tracing apparatus, the defect data module 602 may be configured to obtain defect data of a wafer.

The FB data module 604 may be configured to obtain position data of FBs of the wafer.

The defect area counting module 606 is configured to determine a defect area of a storage block in the wafer according to the defect data.

The FBC module 608 may be configured to determine the FBC of the storage block in the wafer according to the position data of the FBs.

The correlation coefficient module 610 may be configured to process the defect area and the FBC of the storage block in the wafer to obtain a correlation coefficient.

The defect tracing module 612 may be configured to determine an abnormal reason for the FBs of the wafer according to the correlation coefficient.

According to the wafer defect tracing apparatus provided by the implementation mode of the disclosure, a relationship is established by utilizing the defect data of the wafer and the position data of the FB, the correlation coefficient representing the correlation relationship between the defect data and the FB is obtained, whether the defect data is a formation reason for the FB or not is judged based on the correlation coefficient, so that an abnormal reason causing the wafer to generate the FB is facilitated to be determined based on the manufacturing process data of the wafer, an abnormal problem is facilitated to be solved rapidly, and the yield of the wafer is improved.

Figure 7:
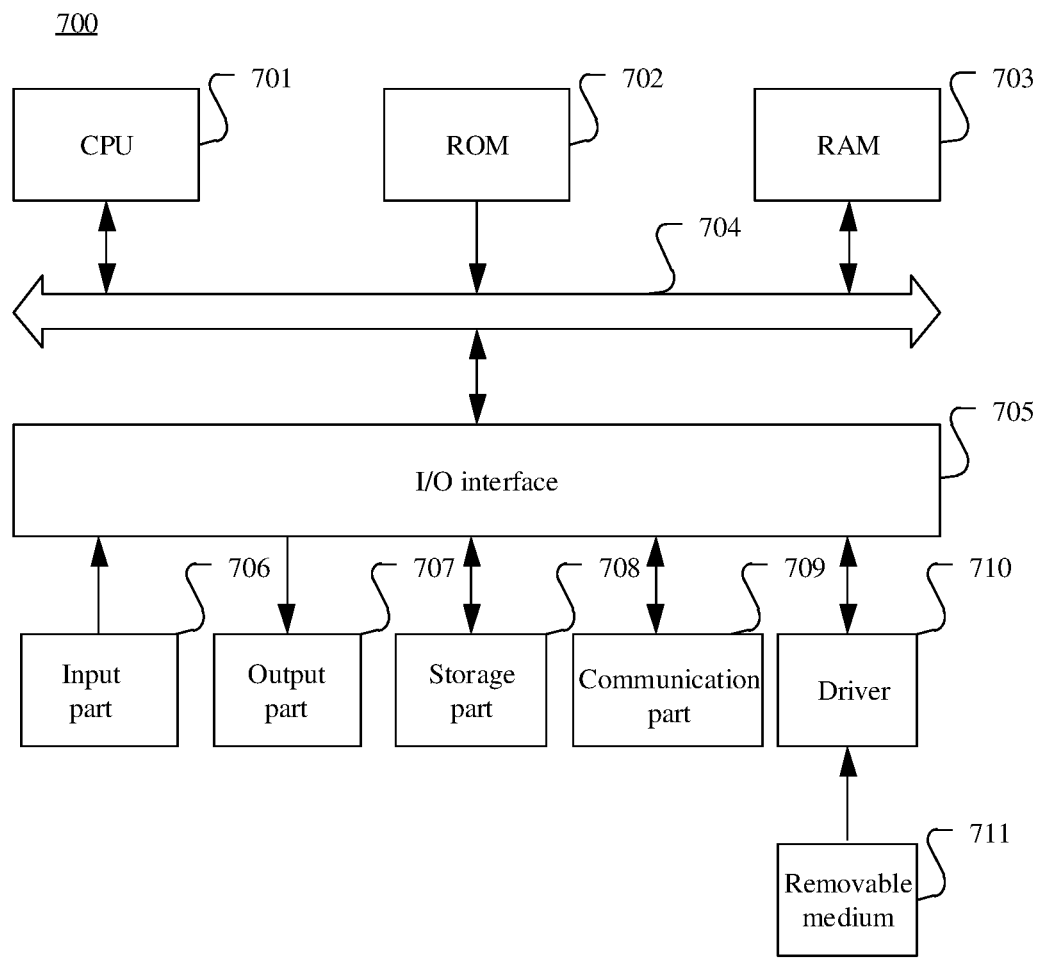
FIG. 7 schematically shows a structural diagram of a computer system suitable for achieving an electronic device in an embodiment of the disclosure.

The following refers to FIG. 7, a schematic structural diagram of a computer system 700 of an electronic device suitable for implementing the embodiment of the disclosure. The computer system 700 of the electronic device in FIG. 7 is only an example and should not form any limit to the functions and scope of application of the embodiments of the disclosure.

As shown in FIG. 7, the computer system 700 may include a CPU 701 that may execute various appropriate actions and processing according to a program stored in a ROM 702 or a program loaded from a storage part 708 to a Random Access Memory (RAM) 703. Various programs and data needed by operations of the system may also be stored in the RAM 703. The CPU 701, the ROM 702 and the RAM 703 are connected with one another through a bus 704. An Input/Output (I/O) interface 705 is also connected to the bus 704.

The following components are connected to the I/O interface 705: an input part 706 including a keyboard, a mouse, etc.; an output part 707 including a Cathode-Ray Tube (CRT), a Liquid Crystal Display (LCD), a speaker, etc.; the storage part 708 including a hard disk, etc.; and a communication part 709 including a Local Area Network (LAN) card and a network interface card of a modem, etc. The communication part 709 executes communication processing through a network such as the Internet. A driver 710 is also connected to the I/O interface 708 as required. A removable medium 711, for example, a magnetic disk, an optical disk, a magneto-optical disk and a semiconductor memory, is installed on the driver 710 as required such that a computer program read therefrom is installed in the storage part 708 as required.

Particularly, the processes described above with reference to the flowcharts may be implemented as computer software programs according to the embodiments of the disclosure. For example, the embodiment of the disclosure may include a computer program product, including a computer program born in a computer-readable storage medium, the computer program including a program code configured to execute the method shown in the flowchart. In this embodiment, the computer program may be downloaded from the network and installed through the communication part 709 and/or installed from the removable medium 711. The computer program is executed by the CPU 701 to execute the function defined in the system of the application.

It is to be noted that the computer-readable storage medium shown in the disclosure may be a computer-readable signal medium or a computer-readable storage medium or any combination of the two. The computer-readable storage medium may be, but not limited to, for example, an electrical, magnetic, optical, electromagnetic, infrared, or semiconductor system, device, or apparatus, or any combination thereof. More specific examples of the computer-readable storage medium may include, but not limited to, an electrical connector with one or more wires, a portable computer disk, a hard disk, a RAM, a ROM, an Erasable Programmable ROM (EPROM) (or a flash memory), an optical fiber, a portable Compact Disc ROM (CD-ROM), an optical storage device, a magnetic storage device, or any proper combination thereof. In the disclosure, the computer-readable storage medium may be any physical medium including or storing a program, and the program may be used by or in combination with an instruction execution system, device, or apparatus. In the disclosure, the computer-readable signal medium may include a data signal in a baseband or propagated as part of a carrier, a computer-readable program code being born therein. A plurality of forms may be adopted for the propagated data signal, including, but not limited to, an electromagnetic signal, an optical signal, or any proper combination. The computer-readable signal medium may also be any computer-readable storage medium except the computer-readable storage medium, and the computer-readable storage medium may send, propagate, or transmit a program configured to be used by or in combination with an instruction execution system, device, or apparatus. The program code in the computer-readable storage medium may be transmitted with any proper medium, including, but not limited to, radio, an electric wire, an optical cable, Radio Frequency (RF), etc. or any proper combination thereof.

The flowcharts and block diagrams in the drawings illustrate probably implemented system architectures, functions, and operations of the system, method, and computer program product according to various embodiments of the disclosure. On this aspect, each block in the flowcharts or the block diagrams may represent part of a module, a program segment, or a code, and part of the module, the program segment, or the code includes one or more executable instructions configured to realize a specified logical function. It is also to be noted that, in some implementations, the functions marked in the blocks may also be realized in a sequence different from those marked in the drawings. For example, two continuous blocks may actually be executed substantially concurrently and may also be executed in a reverse sequence sometimes, which is determined by the involved functions. It is further to be noted that each block in the block diagrams and the flowcharts and a combination of the blocks in the block diagrams and the flowcharts may be implemented by a dedicated hardware-based system configured to execute a specified function or operation, or may be implemented by a combination of a special hardware and a computer instruction.

Describing the unit involved in the embodiments of the disclosure may be implemented by software, or may be implemented by hardware. The described unit may also be set in the processor. The name of the unit does not form any limit to the system in some cases.

As another aspect, the disclosure also provides a computer-readable storage medium. The computer-readable storage medium may be included in the electronic device described in the abovementioned embodiment, or may exist independently and not be assembled in the electronic device. The computer-readable storage medium bears one or more programs. When the one or more programs are executed by the electronic device, the electronic device implements the wafer production process detecting method as described in the abovementioned embodiment.

For example, the electronic device may implement the following operations shown in FIG. 1. At S102, the defect data of the wafer is obtained. At S104, the position data of the FB of the wafer is obtained. At S106, the defect area of the storage block in the wafer is determined according to the defect data. At S108, the FBC of the storage block in the wafer is determined according to the position data of the FB. At S110, the defect area and the FBC of the storage block in the wafer are processed, so as to obtain the correlation coefficient. At S112, the abnormal reason for the FB of the wafer is determined according to the correlation coefficient.

For another example, the electronic device may implement the following various operations shown in FIG. 5.

It is to be noted that, although a plurality of modules or units of an apparatus for action execution are mentioned in the foregoing detailed descriptions, but this division is not mandatory. Actually, according to the implementation modes of the disclosure, the foregoing described features and functions of two or more modules or units may be embodied in a module or unit. On the contrary, the foregoing described features and functions of a module or unit may further be embodied by a plurality of modules or units.

Through the above descriptions about the implementation modes, it is easily understood by those skilled in the art that the exemplary implementation modes described here may be implemented by software, or may be implemented by combining the software and necessary hardware. Therefore, the implementation modes of the disclosure may be embodied in form of a software product, and the software product may be stored in a non-volatile storage medium (which may be a CD-ROM, a U disk, a mobile hard disk, etc.) or a network, including a plurality of instructions enabling a computing device (which may be a personal computer, a server, a touch terminal, a network device, etc.) to execute the method according to the implementation modes of the disclosure.

What is claimed is:

1. A wafer defect tracing method, comprising:
   obtaining defect data of a wafer;
   obtaining position data of fail bits of the wafer;
   determining a defect area of a storage block in the wafer according to the defect data;
   determining a fail bit count of the storage block in the wafer according to the position data of the fail bits;
   processing the defect area and the fail bit count of the storage block in the wafer to obtain a correlation coefficient; and
   determining an abnormal reason for the fail bits of the wafer according to the correlation coefficient;
   wherein processing the defect area and the fail bit count of the storage block in the wafer to obtain the correlation coefficient comprises:
      determining a defect affected region of the wafer according to the defect data;
      determining a defect area index of the storage block in the wafer according to a ratio of the defect area of the storage block in the wafer to an area of the defect affected region;
      determining a fail bit index of the storage block in the wafer according to a ratio of the fail bit count of the storage block in the wafer to the area of the defect affected region; and
      performing correlation analysis on the defect area index and the corresponding fail bit index of the storage block in the wafer to obtain the correlation coefficient.

2. The method according to claim 1, wherein performing correlation analysis on the defect area index and the corresponding fail bit index of the storage block in the wafer to obtain the correlation coefficient comprises:
   removing a storage block containing abnormal data in the wafer to obtain a target storage block set; and
   performing correlation analysis on the defect area index and the corresponding fail bit index of the storage block in the target storage block set to obtain the correlation coefficient.

3. The method according to claim 2, wherein performing correlation analysis on the defect area index and the corresponding fail bit index of the storage block in the target storage block set to obtain the correlation coefficient comprises:
   obtaining a regression line on the defect area index and the corresponding fail bit index of the storage block in the target storage block set to obtain the correlation coefficient.

4. The method according to claim 2, wherein removing the storage block containing the abnormal data in the wafer to obtain the target storage block set comprises at least one of:
   removing a storage block, the fail bit index of which is greater than a fail bit index threshold value, in the wafer to obtain the target storage block set; or
   removing a storage block, the fail bit count of which is greater than a fail bit count threshold value, in the wafer to obtain the target storage block set.

5. The method according to claim 1, wherein determining the abnormal reason for the fail bits of the wafer according to the correlation coefficient comprises:
   obtaining manufacturing process data of the wafer, the manufacturing process data comprising structure layer information and manufacturing process information corresponding to the structure layer information;
   determining the structure layer information where the defect data is located in a case where the correlation coefficient is greater than a correlation coefficient threshold value; and
   determining the abnormal reason according to the manufacturing process information corresponding to the structure layer information where the defect data is located.

6. The method according to claim 5, wherein determining the abnormal reason according to the manufacturing process information corresponding to the structure layer information where the defect data is located comprises:
   obtaining environmental data of the manufacturing process information according to the manufacturing process information corresponding to the structure layer information where the defect data is located; and
   analyzing the environmental data of the manufacturing process information to obtain the abnormal reason.

7. The method according to claim 5, wherein determining the abnormal reason according to the manufacturing process information corresponding to the structure layer information where the defect data is located comprises:
   determining a count of defects that do not cause the fail bits in the wafer according to the defect data and the position data of the fail bits;
   determining a defect cleaned rate of the wafer according to a ratio of the count of the defects that do not cause the fail bits in the wafer to a total defect count in the defect data;
   evaluating the defect cleaned rate of the wafer according to an empirical rule; and
   in a case where an evaluation result is abnormal, determining a step including a cleaning abnormal function in the manufacturing process information as the abnormal reason.

8. An electronic device, comprising:
   at least one processor;
   a storage device, configured to store one or more programs;
   wherein when the one or more programs are executed by the at least one processor, the at least one processor is configured to:
      obtain defect data of a wafer;
      obtain position data of fail bits of the wafer;
      determine a defect area of a storage block in the wafer according to the defect data;
      determine a fail bit count of the storage block in the wafer according to the position data of the fail bits;
      process the defect area and the fail bit count of the storage block in the wafer to obtain a correlation coefficient; and
      determine an abnormal reason for the fail bits of the wafer according to the correlation coefficient;
   wherein the processor is further configured to:
      determine a defect affected region of the wafer according to the defect data;
      determine a defect area index of the storage block in the wafer according to a ratio of the defect area of the storage block in the wafer to an area of the defect affected region;
      determine a fail bit index of the storage block in the wafer according to a ratio of the fail bit count of the storage block in the wafer to the area of the defect affected region; and perform correlation analysis on the defect area index and the corresponding fail bit index of the storage block in the wafer to obtain the correlation coefficient.

9. A non-transitory computer readable medium, having a computer program stored thereon, wherein when the computer program is executed by a processor, the computer program causes the processor to:

obtain defect data of a wafer;

obtain position data of fail bits of the wafer;

determine a defect area of a storage block in the wafer according to the defect data;

determine a fail bit count of the storage block in the wafer according to the position data of the fail bits;

process the defect area and the fail bit count of the storage block in the wafer to obtain a correlation coefficient; and determine an abnormal reason for the fail bits of the wafer according to the correlation coefficient;

wherein the computer program further causes the processor to:

determine a defect affected region of the wafer according to the defect data;

determine a defect area index of the storage block in the wafer according to a ratio of the defect area of the storage block in the wafer to an area of the defect affected region;

determine a fail bit index of the storage block in the wafer according to a ratio of the fail bit count of the storage block in the wafer to the area of the defect affected region; and perform correlation analysis on the defect area index and the corresponding fail bit index of the storage block in the wafer to obtain the correlation coefficient.

\* \* \* \* \*